US012222656B2

(12) United States Patent
Liu et al.

(10) Patent No.: US 12,222,656 B2
(45) Date of Patent: Feb. 11, 2025

(54) METHOD FOR DETERMINING ABERRATION SENSITIVITY OF PATTERNS

(71) Applicant: ASML NETHERLANDS B.V., Veldhoven (NL)

(72) Inventors: Jingjing Liu, San Jose, CA (US); Duan-Fu Stephen Hsu, Fremont, CA (US); Xingyue Peng, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 510 days.

(21) Appl. No.: 17/638,899

(22) PCT Filed: Aug. 21, 2020

(86) PCT No.: PCT/EP2020/073448
§ 371 (c)(1),
(2) Date: Feb. 28, 2022

(87) PCT Pub. No.: WO2021/043596
PCT Pub. Date: Mar. 11, 2021

(65) Prior Publication Data
US 2022/0334493 A1 Oct. 20, 2022

Related U.S. Application Data

(60) Provisional application No. 62/895,372, filed on Sep. 3, 2019.

(51) Int. Cl.
*G06F 30/30* (2020.01)
*G03F 7/00* (2006.01)
*G05B 19/4099* (2006.01)

(52) U.S. Cl.
CPC .............. *G03F 7/706* (2013.01); *G03F 7/705* (2013.01); *G03F 7/70666* (2013.01); *G05B 19/4099* (2013.01); *G05B 2219/45031* (2013.01)

(58) Field of Classification Search
CPC ...... G03F 7/706; G03F 7/705; G03F 7/70666; G03F 7/70433; G03F 7/70441;
(Continued)

(56) References Cited

U.S. PATENT DOCUMENTS 6,046,792 A 4/2000 Van Der Werf et al.
6,961,116 B2 11/2005 Den Boef et al.
(Continued)

FOREIGN PATENT DOCUMENTS

CN 102866590 1/2013
CN 107111239 8/2017
(Continued)

OTHER PUBLICATIONS

International Search Report and Written Opinion issued in corresponding PCT Patent Application No. PCT/EP2020/073448, dated Dec. 2, 2020.
(Continued)

*Primary Examiner* — Jack Chiang
*Assistant Examiner* — Brandon Bowers
(74) *Attorney, Agent, or Firm* — Pillsbury Winthrop Shaw Pittman LLP

(57) ABSTRACT

A method for determining process window limiting patterns based on aberration sensitivity associated with a patterning apparatus. The method includes obtaining (i) a first set of kernels and a second set of kernels associated with an aberration wavefront of the patterning apparatus and (ii) a design layout to be printed on a substrate via the patterning apparatus; and determining, via a process simulation using
(Continued)

the design layout, the first set of kernels, and the second set of kernels, an aberration sensitivity map associated with the aberration wavefront, the aberration sensitivity map indicating how sensitive one or more portions of the design layout are to an individual aberrations and an interaction between different aberrations; determining, based on the aberration sensitivity map, the process window limiting pattern associated with the design layout having relatively high sensitivity compared to other portions of the design layout.

20 Claims, 19 Drawing Sheets

(58) Field of Classification Search
CPC ............ G03F 7/70616; G05B 19/4099; G05B 2219/45031
See application file for complete search history.

(56) References Cited

U.S. PATENT DOCUMENTS

| | | | |
|---|---|---|---|
| 7,587,704 | B2 | 9/2009 | Ye et al. |
| 10,423,075 | B2* | 9/2019 | Feng ................... G03F 7/70125 |
| 11,281,113 | B2* | 3/2022 | Li ....................... G03F 7/70725 |
| 2006/0066855 | A1 | 3/2006 | Boef et al. |
| 2009/0157360 | A1 | 6/2009 | Ye et al. |
| 2009/0296055 | A1* | 12/2009 | Ye ........................... G03F 7/705 716/54 |
| 2010/0141925 | A1 | 6/2010 | Cao et al. |
| 2013/0219351 | A1* | 8/2013 | Shim ......................... G03F 1/70 716/55 |
| 2017/0046473 | A1 | 2/2017 | Fouquet et al. |
| 2017/0147734 | A1* | 5/2017 | Rosenbluth ........... G06F 30/367 |
| 2017/0329231 | A1 | 11/2017 | Finders |

FOREIGN PATENT DOCUMENTS

| | | |
|---|---|---|
| TW | 201602821 | 1/2016 |
| WO | 2018050432 | 3/2018 |
| WO | 2018228 | 12/2018 |

OTHER PUBLICATIONS

Taiwanese Office Action issued in corresponding Taiwanese Patent Application No. 109129096, dated Oct. 14, 2021.
Liu, W. et al.: "Fast algorithm for quadratic aberration model based on cross triple correlation", Proc. of SPIE, vol. 7973 (2011).
Smith, B. et.al.: "Understanding lens aberration and influences to lithographic imaging", Proc. of SPIE, vol. 4000 (2000).
Robins, G. et al.: "Measuring Optical Image Aberrations with Pattern and Probe Based Targets", J. Vac. Sci. Technol. B 20(1) (2002).
Nakajima, Y. et al.: "Aberration budget in extreme ultraviolet lithography", Proc. of SPIE, vol. 6921 (2008).
Flagello, D. et al.: "Towards a comprehensive control of full-field image quality in optical photolithography", Proc. of SPIE, vol. 3051 (1997).
Office Action issued in corresponding Chinese Patent Application No. 202080062062.9, dated Feb. 8, 2024.
Office Action issued in corresponding Chinese Patent Application No. 202080062062.9 dated Sep. 26, 2024.

* cited by examiner

METHOD FOR DETERMINING ABERRATION SENSITIVITY OF PATTERNS

CROSS-REFERENCE TO RELATED APPLICATIONS

This application is the U.S. national phase entry of PCT Patent Application No. PCT/EP2020/073448 which was filed on Aug. 21, 2020, which claims the benefit of priority of U.S. Provisional Application No. 62/895,372 which was filed on Sep. 3, 2019 and which is incorporated herein in its entirety by reference.

TECHNICAL FIELD

The description herein relates generally to apparatus and methods of an aberration sensitivity of patterns and optimizing patterning process, or aspects related to patterning process based on the aberration sensitivity.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method of determining process window limiting patterns (PWLP) based on aberration sensitivity associated with a patterning apparatus. The method includes obtaining (i) a first set of kernels and a second set of kernels associated with an aberration wavefront of the patterning apparatus, and (ii) a design layout to be printed on a substrate via the patterning apparatus; and determining, via a process simulation using the design layout, the first set of kernels, and the second set of kernels, an aberration sensitivity map associated with the aberration wavefront, the aberration sensitivity map indicating how sensitive one or more portions of the design layout are to a particular aberration and an interaction between different aberrations; and determining, based on the aberration sensitivity map, the PWLP associated with the design layout having relatively high sensitivity compared to other portions of the design layout.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
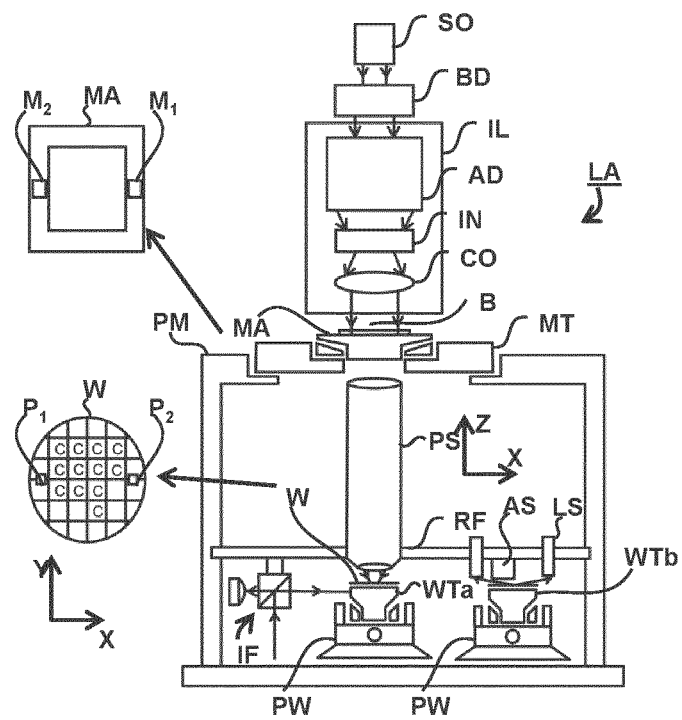
FIG. 1 schematically depicts a lithography apparatus, according to an embodiment.

FIG. 1 schematically depicts an embodiment of a lithographic apparatus LA. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as G-outer and G-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
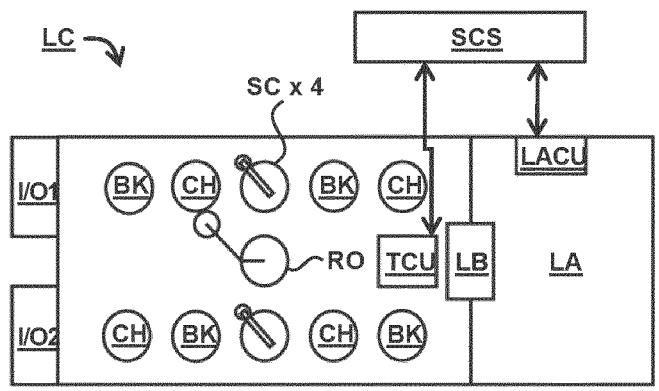
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU.

Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

The fabrication process (e.g., FIG. 2) includes more than one scanner (i.e., a lithographic apparatus) exhibiting different performances (e.g., in terms of patterns printed on a substrate). To provide consistent performance (e.g., consistent contour or CD) between different scanners or with respect to a reference performance, a wavefront optimization may be performed according to methods of the present disclosure.

In an embodiment, an optimization can be performed using, for example, an objective function, such as $$CF(z_1, z_2, \ldots, z_N) = \Sigma_{p=1}^{P} w_p f_p^2(z_1, z_2, \ldots, z_N) \quad (1)$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, or any point on a patterning device pattern, or resist image, or aerial image.

The objective function may represent any suitable characteristics of the patterning process, such as of the lithographic projection apparatus or the substrate, for instance, focus, CD, image shift, image distortion, image rotation, etc. For example, the objective function may be a function of one or more of the following lithographic metrics: edge placement error, critical dimension, resist contour distance, worst defect size, pattern shift, stochastic effect, three-dimensional effect of the patterning device, three-dimensional effect of the resist, best focus shift, pupil fill factor, exposure time, and/or throughput. Since it is the resist image that often dictates the pattern on a substrate, the objective function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p (z_1, z_2, \ldots, z_N)$). The design variables can be any adjustable parameters such as adjustable parameters of the wavefront.

The lithographic apparatus may include one or more components collectively called a "wavefront manipulator" that can be used to adjust shapes of a wavefront, intensity distribution, and/or phase shift of the radiation beam. The wavefront can be adjusted at any location along an optical path of the lithographic projection apparatus, such as before the patterning device, near a pupil plane, near an image plane, or near a focal plane. The projection optics can be used to correct or compensate for certain distortions of the wavefront caused by, for example, the illumination, the patterning device, temperature variation in the lithographic projection apparatus, and/or thermal expansion of components of the lithographic projection apparatus. Adjusting the wavefront can change values of the evaluation points and the objective function. Such changes can be simulated from a model or actually measured.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, for example, minimizing the weighted RMS of $f_p(z_1, z_2, \ldots, z_N)$ is equivalent to minimizing the objective function $CF(z_1, z_2, \ldots, z_N) = \sum_{p=1}^{P} w_p f_p^2(z_1, z_2, \ldots, z_N)$, defined in Eq. 1. Thus the weighted RMS of $f_p(z_1, z_2, \ldots, z_N)$ and Eq. 1 may be utilized interchangeably for notational simplicity herein.

The optimization process is to find a set of values of the design variables, under the constraints $(z_1, z_2, \ldots, z_N) \in Z$, that, e.g., minimize the objective function, i.e., to find $$(\tilde{z}_1, \tilde{z}_2, \ldots, \tilde{z}_N) = \operatorname*{argmin}_{(z_1, z_2, \ldots, z_N) \in Z} CF(z_1, z_2, \ldots, z_N) = \quad (2)$$

-continued
$$\operatorname*{argmin}_{(z_1, z_2, \ldots, z_N) \in Z} \sum_{p=1}^{P} w_p f_p^2(z_1, z_2, \ldots, z_N)$$

The optimization does not necessarily lead to a single set of values for the design variables (e.g., wavefront parameters). In addition, there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In an embodiment, an algorithm, such as the Gauss-Newton algorithm, the Levenberg-Marquardt algorithm, the gradient descent algorithm, simulated annealing, the genetic algorithm, etc. can be applied to evaluate and solve the objective function.

Existing method to determine aberration sensitivity of patterns (e.g., of design layout) based on, for example, Zernike sensitivity analysis for CD, or pattern placement error (PPE) of the patterns. Such CD or PPE based analysis include determining, at evaluation points (e.g., on cutlines across the pattern, see FIG. 12), CD and/or PPE. This CD and/or PPE determination require a priori knowledge on aberration hot spots. For example, a lithographic manufacturability check (LMC) based hotspot determination includes classifying, sorting and ranking all the hotspots. Then, hotspots caused by aberration must be identified.

In an example existing approaches, a hot spot detection is based on tracing image contours within, e.g., 0.05 nm error budget. For example, a simulated image or a measured image (e.g., SEM image) of the patterns on a substrate is obtained. From the image, a pattern contour is traced using, for example, image processing algorithms such as edge detection or other edge tracing algorithm. Then, using the traced contours, a difference with respect to a desired contour is computed. Further a check is performed whether the difference exceeds the error budget (e.g., 0.05 nm).

Furthermore, the determination of hotspots require obtaining accurate contours of the patterns. Hence, the computation of contour tracing (or simulation of patterns) of the patterns should as accurate as possible. So, the exiting models may need 48 transmission cross coefficients (TCC) kernels, which is computational expensive. For example, an aerial image may be determined using Hopkin's formulation with 48 transmission cross coefficient (TCC) for representing image intensity. TCC is an autocorrelation of an illumination pupil multiplied by a projection pupil (e.g., a lens pupil).

Thus, the existing approaches need significant pre-processing to identify hotspots and then determine aberration sensitivity of such hot spots.

In addition to computational limitations, the existing approach have several other limitation. For example, LMC based hotspots are detected per Zernike term and do not consider the constructive/destructive effects of combined Zernike terms which overestimate the hotspots. For example, when Zernike's interact, some interactions amplifies the aberration effects on the patterns while some interactions cancels the aberration effects. Such interactions may not be accounted for in the existing methods. Also, current computation through the finite difference between an aberrated aerial image and unaberrated aerial image may require 48 or higher order TCC kernels which are computationally intensive for a full chip application.

The method of present disclosure can identify aberration-induced hotspot detection using, e.g., Zernike cross coefficient (ZCC) kernels. The number of ZCC kernels are significantly less (e.g. 4 ZCC kernels) compared with TCC kernels which are used for wafer contour tracing and CD calculation. Thus, the present method greatly reduces the computation burden compared to the existing methods. In addition, the present methods do not require contour tracing, CD, and/or PPE determinations. Thus, the present method is computationally faster and/or computationally less resources intensive compared to existing methods.

Figure 3:
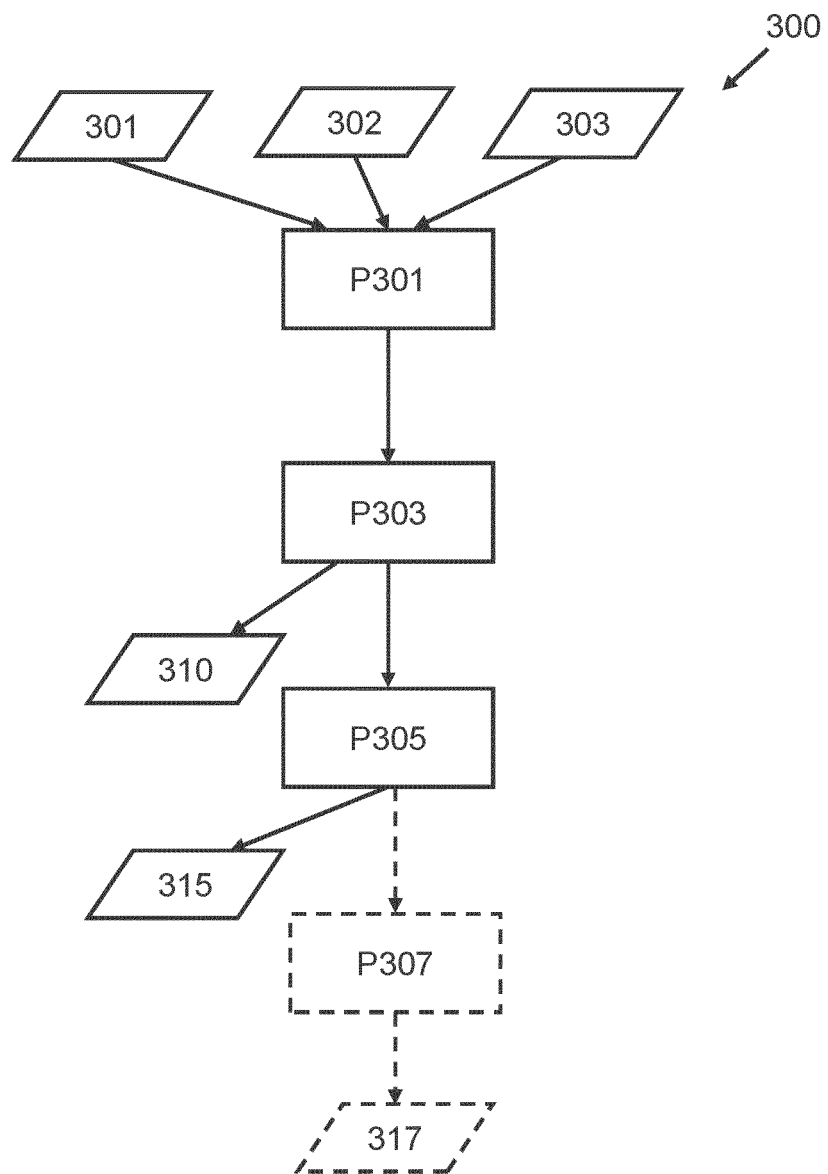
FIG. 3 is a flow chart of a method 300 of determining pattern window limiting patterns (PWLP) based on aberration sensitivity associated with a patterning apparatus, according to an embodiment.

FIG. 3 is a flow chart of a method 300 of determining pattern window limiting patterns (PWLP) based on aberration sensitivity associated with a patterning apparatus. Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. This is non exhaustive list of defects and additional defect types and corresponding defect detectors may be defined. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Such hot spots may be caused due to one or more of the process parameters (e.g., dose, focus, etc.), characteristics of an apparatus (e.g., aberration of a lens pupil of a lithographic apparatus), or other variables related to hot spots. According to the present disclosure, the method is described for determining aberration-induced hotspots.

The present method 300 has several advantage. As mentioned earlier, the present method require significantly less number of kernels to compute an aberration sensitivity map as compared with those which are used for tracing image contour and contour based hot spot detection. In an embodiment, a Zernike image is calculated by convolution between an electric field (e.g., mask image) and ZCC kernels. The computation can be performed on a coarse grid size (e.g. for EUV model pixel size >4 nm) without the intensive computation burden. A fast image based aberration sensitivity calculation method is capable of doing full chip computation.

Furthermore, the method 300 is applicable to any polynomial expansion of wavefront, including Zernike polynomial, Bessel functions and Legendre polynomials, et al. The method 300 is not limited by a particular process model, and is applicable to any e.g., optical model and resist model used to model a patterning process. The method 300 is applicable to any NA and wavelength. The method 300 is applicable to any chip design (Memory, logic and microprocessor) including full chip design. The steps or procedures of the method 300 are described in detail as follows.

Procedure P301 includes obtaining (i) a first set of kernels 301 and a second set of kernels 302 associated with an aberration wavefront of the patterning apparatus, and (ii) a design layout 303 to be printed on a substrate via the patterning apparatus.

In an embodiment, the aberration wavefront is represented by any normal and complete function set such as Zernike, Bessel function, or user-defined function that are orthonormal. As a non-limiting example, the aberration wavefront is represented by a set of Zernike polynomials or a bitmap image. The present method proposes following example formulation to obtain an aberration sensitivity of patterns. For example, an aberration wavefront W(ρ) can be expanded by Zernike polynomials:

$$W(\rho) = \sum_m c_m \cdot Z_m$$

In an embodiment, the aberration wavefront may be perturbed to determine aberration sensitivity. For example, for the wavefront perturbation of W(ρ), a Taylor expansion may be performed as follows:

$$e^{-ik_0 W(\rho)} = 1 - ik_0 W(\rho) - \frac{k_0^2}{2} W(\rho)$$

In the above formulation, W is the aberration wavefront, $k_0$ is a wave vector (nm$^-$), ρ is a normalized wave vector (unitless), $Z_m$ represent Zernike polynomials, $c_m$ represent Zernike coefficients that characterizes an amount of aberration (nm) explained by an associated Zernike polynomial $Z_m$. The above example Taylor series expansion is up to $2^{nd}$ order terms. However, the present disclosure is not limited to such expansion and other higher other terms may also be included.

In an embodiment, the first set of kernels 301 are obtained by eigen decomposition of a first vector associated with a first order aerial image comprising linear aberration terms of the aberration wavefront. In an embodiment, the first aerial image is computed by a convolution of a source function, a pupil function, and first order aberrations, the first order aberrations characterize effects of linear aberration terms. In an embodiment, the source function is a mathematical representation characterizing a illumination source of the patterning apparatus, and the pupil function is another mathematical representation characterizing a lens pupil of the patterning apparatus. Such mathematical represents of illumination source and the pupil are known and does not limit the scope of the present disclosure.

In an embodiment, a first order aerial image may be determined using following:

$$I_1^{(m)}(x) = k_0 \iint d\rho d\rho' M(\rho) M^*(\rho') B_1^{(m)}(\rho,\rho') e^{i(\rho-\rho')x}$$

In the above equation, $I_1$ is a first order aberration sensitivity of Zernike m (nm$^{-1}$), x represents any location (e.g., evaluation point on a pattern) of the aerial image, S is a mathematical representation of the illumination source, H is the aerial image at each source point $\rho_0$, M(ρ) is the mask diffraction pattern, and P is the pupil function. In an embodiment, the source function is represented as a pixelated image of the illumination source used by the patterning apparatus. The first vector $B_1^{(m)}$ in the above formulation can be computed as follows:

$$B_1^{(m)}(\rho,\rho') = -i \int d\rho_0 S(\rho_0) P(\rho-\rho_0) P^*(\rho'-\rho_0) [Z_m(\rho-\rho_0) - Z_m(\rho'-\rho_0)]$$

After determining the $B_1^{(m)}$ for a particular Zernike (e.g., Z7 illustrated in FIGS. 4A and 4B), eigen decomposition of $B_1^{(m)}$ is performed to obtain the first Zernike kernels (also referred as first Zernike Cross Coefficient (ZCC) kernels). In an embodiment, the first ZCC kernel can be considered as the first order aberration sensitivity filter for a specific Zernike term m.

Figure 4A:
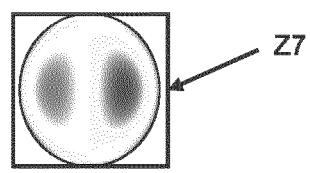
FIG. 4A illustrates an example Zernike polynomial Z7 in image format, according to an embodiment.
Figure 4B:
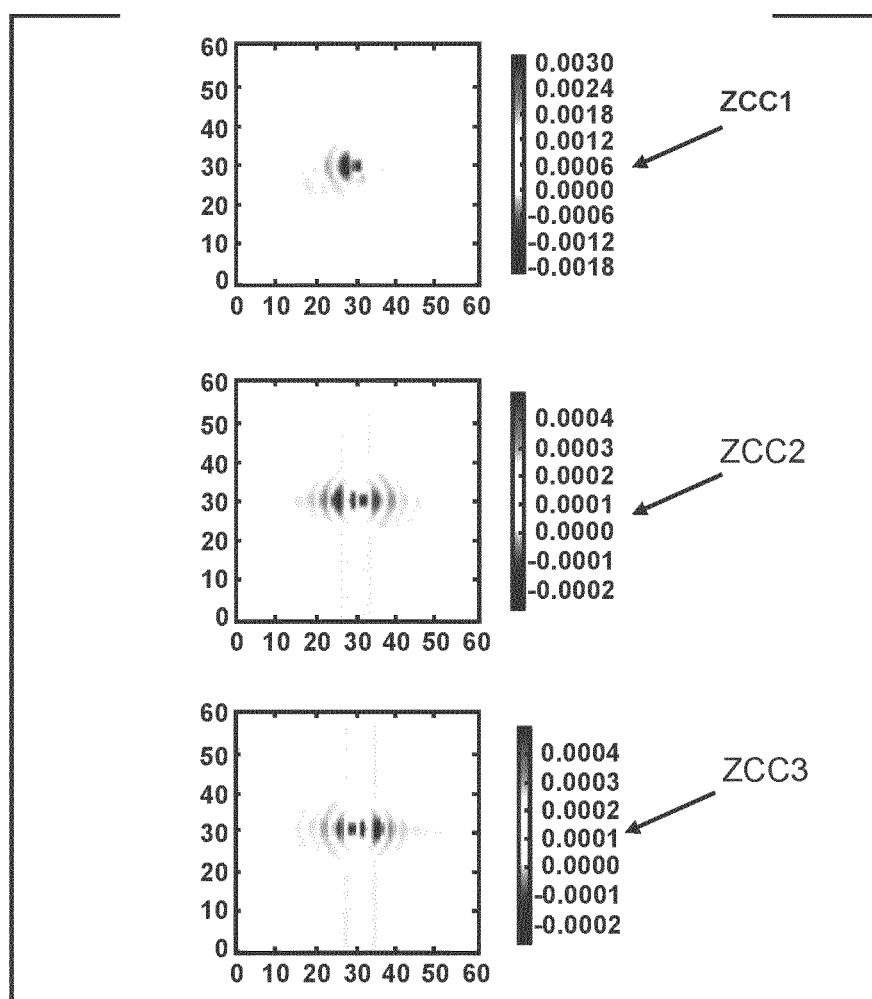
FIG. 4B illustrates example first order kernels obtained for the Zernike Z7, according to an embodiment.

FIG. 4A illustrates an example Zernike polynomial Z7 in image format and FIG. 4B illustrates example first order kernels (an example of the first set of kernels) obtained for the Zernike Z7. Applying equation the $B_1^{(7)}$ equation, where m=7 and a given source function (e.g., a source image) and a given pupil function (e.g., a lens pupil image), the first vector $B_1^{(7)}$ can be computed. Further, an eigen decomposition can be performed on $B_1^{(7)}$ to generate the elements of the first order kernel. In FIG. 4B, first three elements of the first kernels are ZCC1, ZCC2, and ZCC3. In the present example, ZCC1, ZCC2, and ZCC3 are represented as images. However, in an embodiment, the kernels can be represented in vector or matrix format for computation purposes.

Further using the first order kernel, a first order aerial image 500A (e.g., in FIG. 5A) for any mask (e.g., M) can be generated.

$$I_1^{(7)} \Sigma \lambda_i |M \otimes ZCCi^{(7)}|^2$$

Figure 5A:
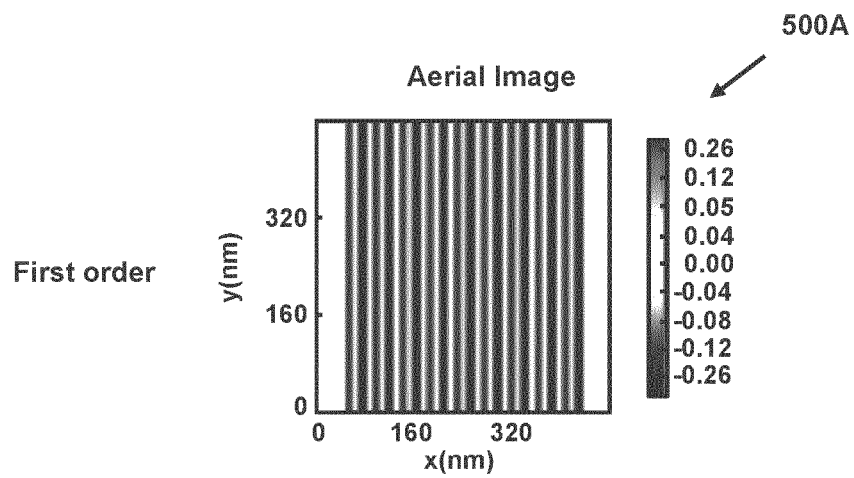
FIG. 5A illustrates an example first order aerial image obtained using a first set of kernels for a design pattern, according to an embodiment.

FIG. 5A illustrates an example first order aerial image 500A obtained using the equation of $I_1^{(7)}$ above, where the mask or design layout (M) comprises vertical lines.

In an embodiment, the second set of kernels 302 are obtained by eigen decomposition of a second order vector associated with a second aerial image comprising second order aberration terms of the aberration wavefront. In an embodiment, the second order aerial image is computed by a convolution of the source function, the pupil function, and second order aberrations, the second order aberrations characterize effects of interaction between individual aberration. The source function is the mathematical representation characterizing the illumination source of the patterning apparatus, and the pupil function is the another mathematical representation characterizing the lens pupil of the patterning apparatus.

In an embodiment, a second order aerial image may be determined using following:

$$I_2^{(m,n)}(x) = k_0^2 \iint d\rho d\rho' M(\rho) M^*(\rho') B_2^{(m,n)}(\rho,\rho') e^{i(\rho-\rho')x}$$

In the above equation, $I_2^{(m,n)}(x)$ is a second order aberration sensitivity of Zernike m, n ($nm^{-2}$), S is a mathematical representation of the illumination source, H is the aerial image at each source point $\rho_0$, $M(\rho)$ is the mask diffraction pattern, and P is the pupil function. In an embodiment, the source function is represented as a pixelated image of the illumination source used by the patterning apparatus. The second vector $B_2^{(m,n)}$ in the above formulation can be computed as follows:

$$B_2^{(m,n)}(\rho,\rho') = i \int d\rho_0 S(\rho_0) P(\rho-\rho_0) P^*(\rho'-\rho_0)(Z_m(\rho-\rho_0) - Z_m(\rho'-\rho_0))(Z_n(\rho-\rho_0) - Z_n(\rho'-\rho_0))$$

After determining the $B_2^{(m,n)}$ for a particular Zernike interaction (e.g., Z5 and Z7), eigen decomposition of $B_2^{(m,n)}$ is performed to obtain the second Zernike kernels (also referred as second Zernike Cross Coefficient (ZCC) kernels). In an embodiment, the first ZCC kernel can be considered as the second order aberration sensitivity filter for a specific Zernike term m, n.

In an embodiment, the first set of kernels 301 and the second set of kernels 302 are dependent on parameters associated with an illumination source of the patterning apparatus, a lens pupil of the patterning apparatus, and Zernike terms describing the aberration wavefront associated with the patterning apparatus, but independent of a shape of the design layout 303.

In an embodiment, the design layout 303 is at least one of: a pre-OPC mask layout (e.g., a design layout before optical proximity corrections (OPC) are applied); a post-OPC mask layout (e.g., a design layout after optical proximity corrections (OPC) are applied); or a mask image generated from the post-OPC mask layout, where the mask image represents a mask diffraction pattern obtained by illuminating the post-OPC mask layout with the illumination source. Typically, the design layout 303 will include one or more patterns, where a pattern may further include a plurality of features (e.g. line, contact holes, etc.).

In the present method, a pattern of any shape may be used in the design layout. For example, in an embodiment, a pattern of the one or more patterns comprises a plurality of features and a portion of the pattern is a feature of the plurality of features. In an embodiment, the one or more patterns comprises rectilinear mask patterns; lines and spaces; contact holes; and/or curvilinear mask patterns.

Procedure P303 includes determining, via a process simulation (e.g., in FIG. 13) and using the design layout 303, the first set of kernels 301, and the second set of kernels 302, an aberration sensitivity map 310 associated with the aberration wavefront. In an embodiment, the aberration sensitivity map 310 indicates how sensitive one or more portions of the design layout 303 are to an individual aberration (e.g., a particular Zernike) and an interaction between different aberrations (e.g., between two Zernikes such as Z5 and Z7).

In an embodiment, the aberration sensitivity map 305 is a function of the set of Zernike polynomials and a set of Zernike coefficients associated therewith, each Zernike coefficient indicative of an amount of aberration explained by the associated Zernike polynomial. In an embodiment, the aberration sensitivity map 310 is a pixelated image, wherein a pixel value is indicative of the aberration sensitivity.

In an embodiment, the determining of the aberration sensitivity map 310 includes determining a first order aberration sensitivity map (e.g., show in FIG. 4B) by applying the first set of kernels 301 to the design layout 303; determining a second order aberration sensitivity map (not shown) by applying the second set of kernels 302 to the design layout 303; and determining the aberration sensitivity map 310 as a sum of the first order aberration sensitivity map, and the second order aberration sensitivity map. Furthermore, the aberration sensitivity map includes unaberrated aerial image. Hence, the aberration sensitivity map may be referred as a delta image, where the delta image characterizes a difference between an unaberrated aerial image and aberrated aerial image.

Figure 5B:
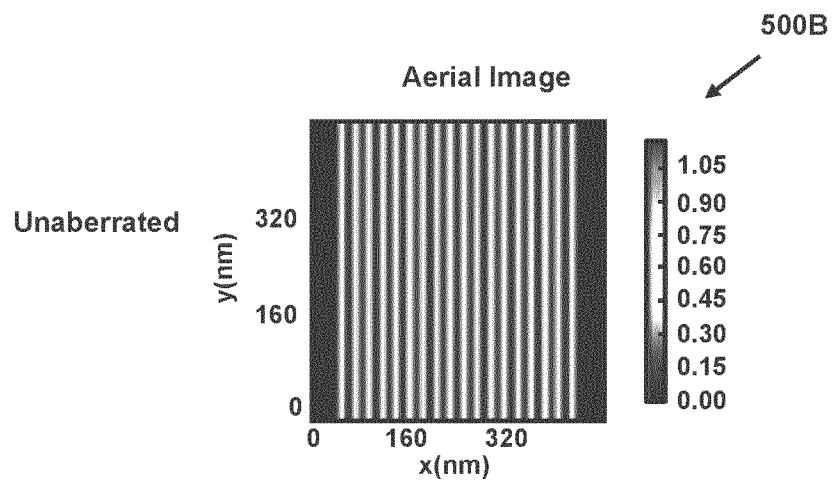
FIG. 5B illustrates an unberrated aerial image for the design pattern, according to an embodiment.
Figures 6A, 6B:
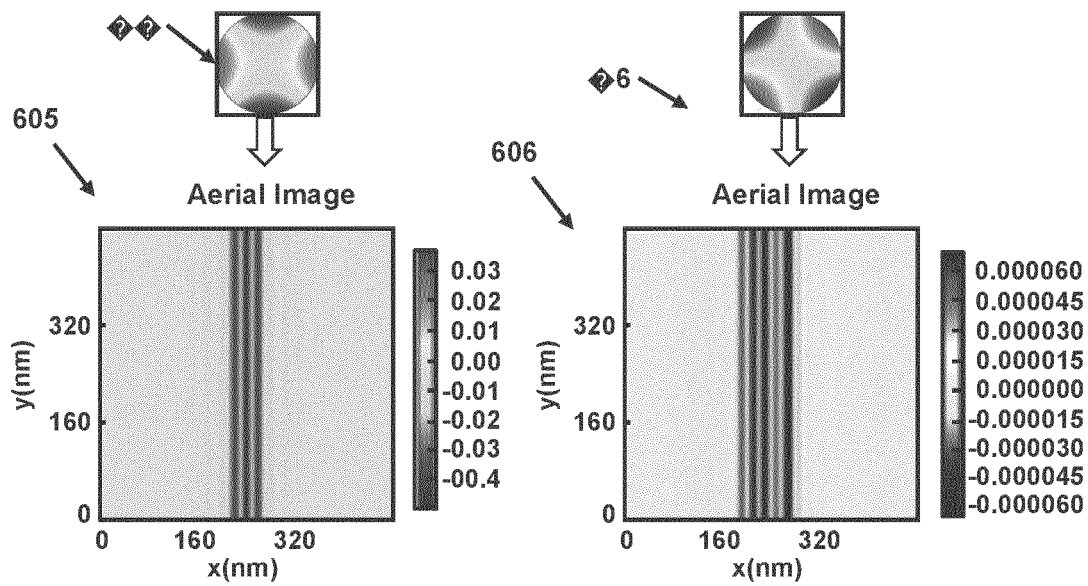
FIGS. 6A-6H illustrate example first order images associated with example first order ZCC kernels associated with Zernikes Z5-Z10 and Z35-Z36 of a set of Zernikes Z5-Z36, according to an embodiment.
Figures 6C, 6D:
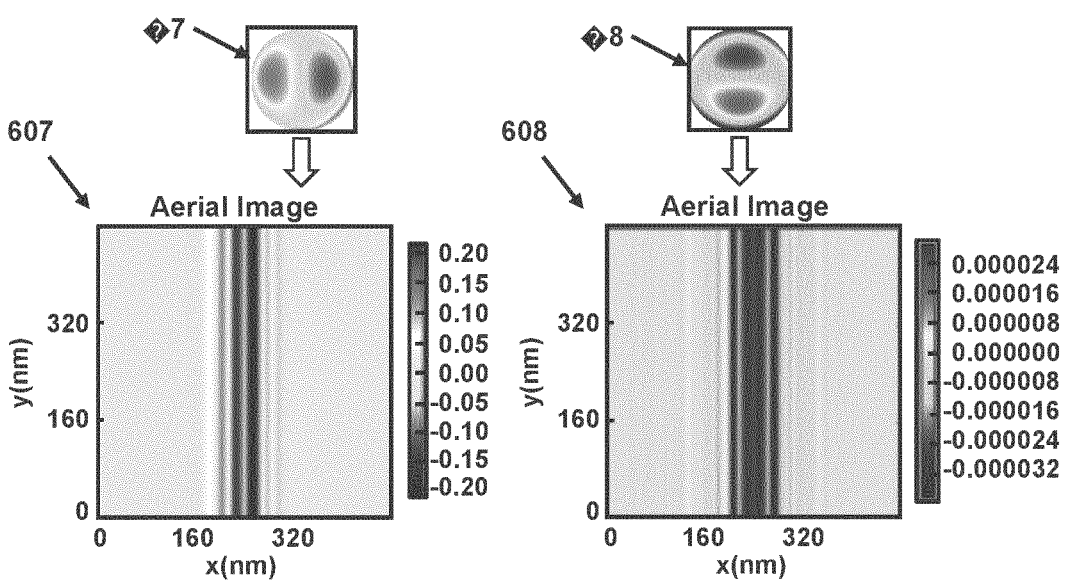
Figure 6E:
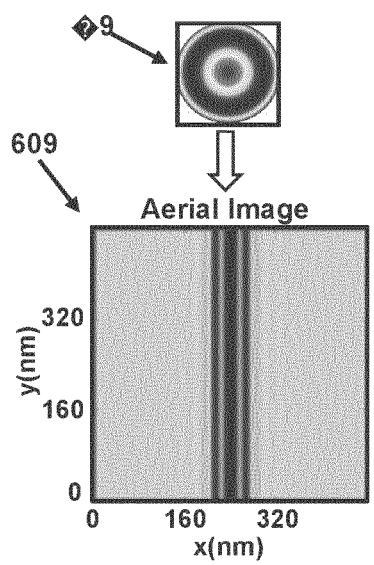
Figure 6F:
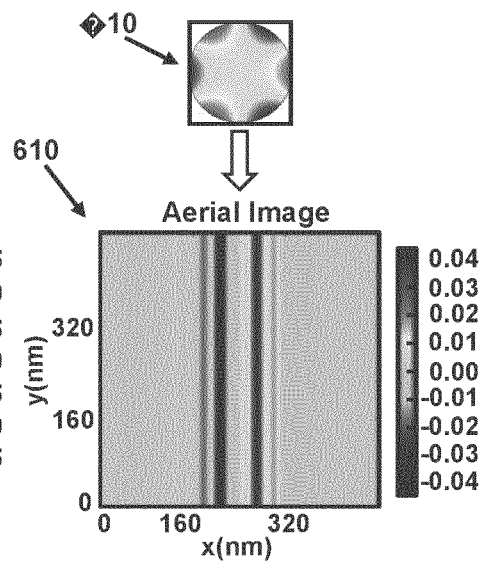
Figure 6G:
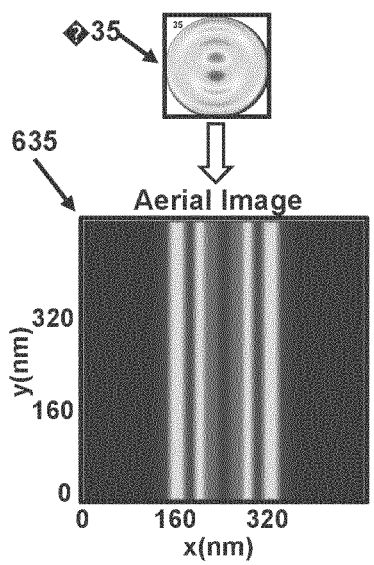
Figure 6H:
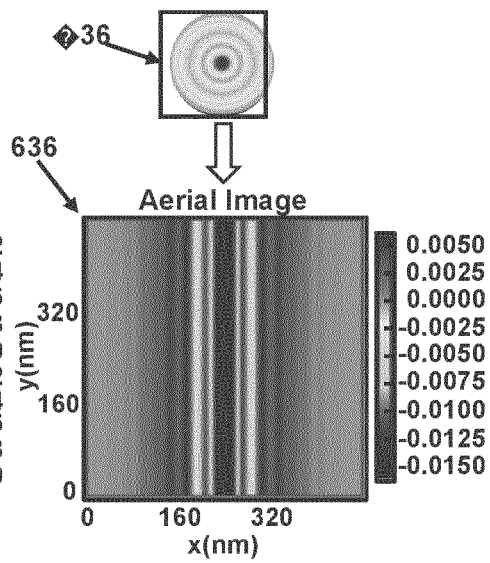

FIG. 4B illustrates an example of the first set of kernels 301, further based on kernels 301 the first order aerial image (see FIG. 5A) is obtained. Similarly, a second set of kernels 302 can be used to determine the second order aerial image. In an embodiment, an unaberrated aerial image 500B (e.g. an ideal aerial image) show in FIG. 5B may be obtained for example using Hopkins formulation. Then, the aberration sensitivity map may be determined as a total of the unaberrated aerial image, the first order image, and the second order image. In an embodiment, the aberration sensitivity map 310 is determined using following formulation:

$$I(x) = I_0(x) + \sum_m c_m \cdot I_1^{(m)}(x) + \sum_m \sum_n c_m c_n \cdot I_2^{(m,n)}(x)$$

In the above equation, the terms are previously addressed. For example, $Z_m$ refers to a Zernike polynomials, $c_m$ is a Zernike coefficient, $I_0(x)$ is an unaberrated aerial image, $I_1^{(m)}(x)$ is the first order aerial image, $I_2^{(m,n)}(x)$ is the second order aerial image, and $I(x)$ is a total aerial image or aberration sensitivity map according to present disclosure. In an embodiment, the aberration sensitivity map $I(x)$ is used as map 310 to identify hotspots. Further, wavefront optimization may be performed to determine wavefront parameters (e.g., tilt, orientation, etc. of a mirror of the pupil) such that an aberration sensitivity of the hotspots is reduced.

In an embodiment, the first set of kernels 301 may be considered a first order aberration sensitivity filter for a given Zernike of the set of Zernike polynomials. In an embodiment, the second set of kernels 302 may be considered as a second order aberration sensitivity filter for a given Zernike of the set of Zernike polynomials. In order words, using the first set of kernels 301 and the second set of kernels 302, a first order and a second order components, respectively, of the aberration sensitivity map may be filtered out.

Procedure P305 includes determining, based on the aberration sensitivity map 310, the PWLP 315 associated with the design layout 303 having relatively high sensitivity compared to other portions of the design layout 303. In an embodiment, the determining of the PWLP 315 includes determining whether an intensity of a pixel of the aberration sensitivity map 310 crosses a hot spot threshold. A hot spot threshold value refers to an intensity value that may be relatively high or relatively low compared to a nominal intensity value range (e.g., within 3 sigma of mean intensity value of the image) associated with the aberration sensitivity map.

Then, responsive to the intensity breaching the threshold value, one or more patterns within the design layout 303 associated with the pixels breaching the threshold are identified. Based on the identified patterns, the method categorizes the identified patterns or locations around the identified patterns as the PWLP 315.

In an embodiment, the PWLP 315 are determined based on the aberration sensitivity map 310 without tracing a contour of a printed pattern or a simulated pattern, or computing a critical dimension or edge placement error or defects data associated with a printed substrate Hence, several computation steps associated with existing approaches are not performed by the present method. As such the computation efficiency of hot spot determination is greatly improved. In existing technology, the contour accuracy required for correctly calculating and identifying the hot spots requires large number of kernels e.g. more than 48 TCC kernels. On the other hand, aberration sensitivity map can achieve such hot spot detection in significantly less number of kernels (e.g. 4 ZCC kernels) that can serve as a performance indicator.

In addition, the present method includes a second order aberration sensitivity analysis that improves aberration corrections. In other words, if certain Zernike effects are combined (e.g., cancelled) then, appropriate corrections can be applied based on other Zernikes. Hence, more accurate corrections to an aberration wavefront can be performed. This improved aberration wavefront when used to image a hot spot pattern results in printed patterns that satisfy design specification thereby reducing chances of defect occurrences.

In an embodiment, the method further includes procedure P307 for determining source parameters, mask parameters and/or wavefront parameters 317 based on the aberration sensitivity map. For example, the procedure P307 includes: determining, based on an unaberrated aerial image, and aberrated aerial images, a Zernike image, wherein the aberrated aerial image is determined based on the first, the second order and higher order (order >2) sensitivity maps; determining, via principal component analysis of the Zernike image, one or more principal components of the Zernike image, a principal component being a linear combination of Zernike polynomials and associated Zernike coefficients, wherein a value of a Zernike coefficient is indicative of an amount of variation in Zernike image explained by the associated Zernike polynomial; selecting, based on at least one of the principal components, patterns associated with relatively a high sensitivity value to a particular Zernike polynomial; and determining, via executing a source mask optimization or a wavefront optimization process using the selected patterns, source parameters, mask parameters and/or wavefront parameters such that a performance metric is improved.

In an embodiment, source mask optimization modifies a source parameter (e.g., illumination intensity, focus, shape, etc.), a mask parameters (e.g., OPC), or both source and mask parameters for selected patterns (e.g., hot spots 315) of the design layout. Such modification results in improved imaging performance (e.g., less defects) for an aberrated lens of the patterning apparatus. In an embodiment, the performance metric used may be a function of CD or an edge placement error associated with the selected patterns.

In an embodiment, a wavefront parameter may be modified via actuators associated with the projection system of the patterning apparatus. For example, the wavefront parameters are related to coefficients of the Zernike polynomial. In embodiment, wavefront parameters may be a tilt, an offset, and/or an orientation of a mirror of a lens used in a patterning apparatus. When such wavefront parameters are adjusted a new wavefront is generated. In an embodiment, the wavefront parameters are determined to minimize aberration sensitivity of selected patterns. Once an optimized wavefront for tuning the patterning apparatus is determined, the method may further involve converting, via the lens model, the wavefront parameters to the actuator movements, and actuating the optical system of the tuning apparatus based on the actuator movements.

FIGS. 6A-6H, 7 and 8 illustrate example of obtaining principal components of a first order Zernike image based on first order kernels. FIG. 6A-6H illustrate example first order images associated with example first order ZCC kernels associated with Zernikes Z5-Z10 and Z35-Z36 of a set of Zernikes Z5-Z36. In the present example, a first order image 605 can be obtained for Z5 using a first order kernel for Z5. Similarly, first order aerial images 606, 607, 608, 609, 610, . . . , 635, and 636, can be obtained for each of the Zernike Z6-Z36, respectively. In the present example, the aerial images (also referred as first order Zernike images) 605-636 are for a portion of the design layout containing two vertical lines.

Figure 7:
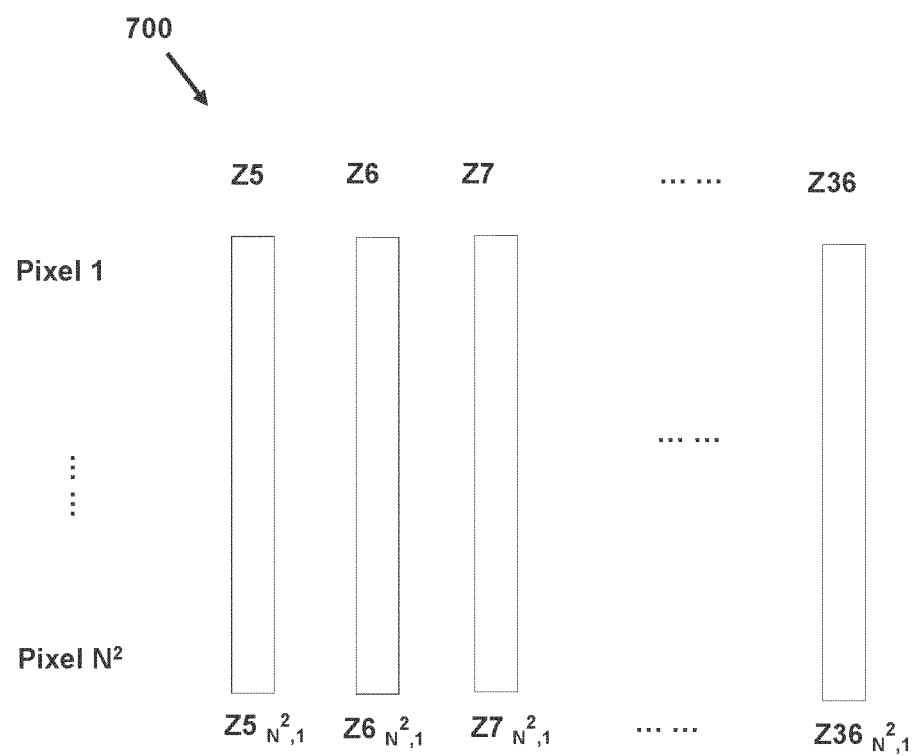
FIG. 7 illustrates an example matrix generated using pixel intensity of each of the Zernike images, according to an embodiment.

FIG. 7 illustrates an example image matrix 700 generated using pixel intensity of each of the Zernike images. For example, the image has N×N pixels, then a first order Zernike image obtained for each Zernike may be represented as a column of the $N^2 \times 1$ matrix, as illustrated. Further using the Zernike image matrix, principal component analysis may be performed. For example, a first principal component can be calculated as follows:

$$PC_1 = \Sigma_i \alpha_i Z_i, \text{ such that } \Sigma_i |\alpha_i|^2 = 1$$

In the above equation, $PC_1$ is the first principal component, $\alpha_i$ is a PCA coefficient associated with a particular Zernike $z_i$. The PCA coefficient is indicative of how much variation in Zernike image matrix is explained by a particular Zernike polynomial.

Figure 8:
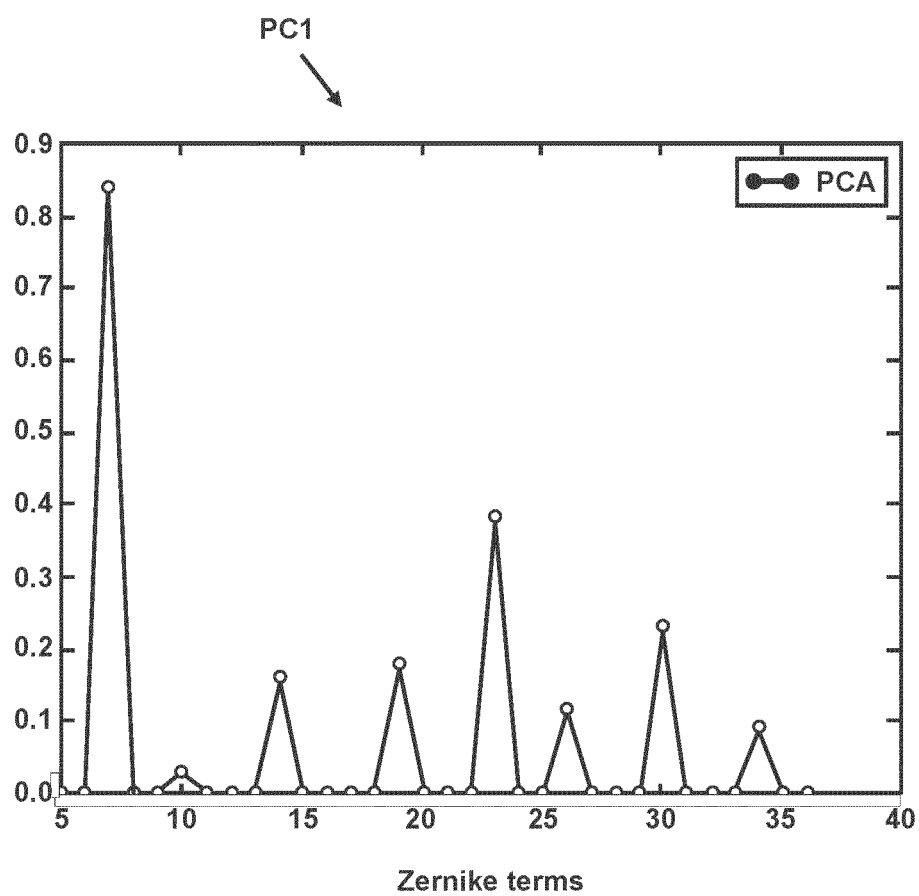
FIG. 8 is a graphical representation of an example PCA component $PC_1$ of the Zernike images (e.g., in FIGS. 6A-6H), according to an embodiment.

FIG. 8 is a graphical representation of an example PCA component $PC_1$ which indicates that Zernike Z7 and Z23 explains most of the variation in the Zernike images (e.g., 605-636 in FIGS. 6A-6H). Such PCA is a linear combination of Zernike polynomial and associated coefficients. Hence, a combined effect of the Zernike's is accounted for in the aberration sensitivity analysis. Further, such PCA can be used to determine hot spot patterns, as discussed with respect to example FIGS. 9-11.

Figure 9:
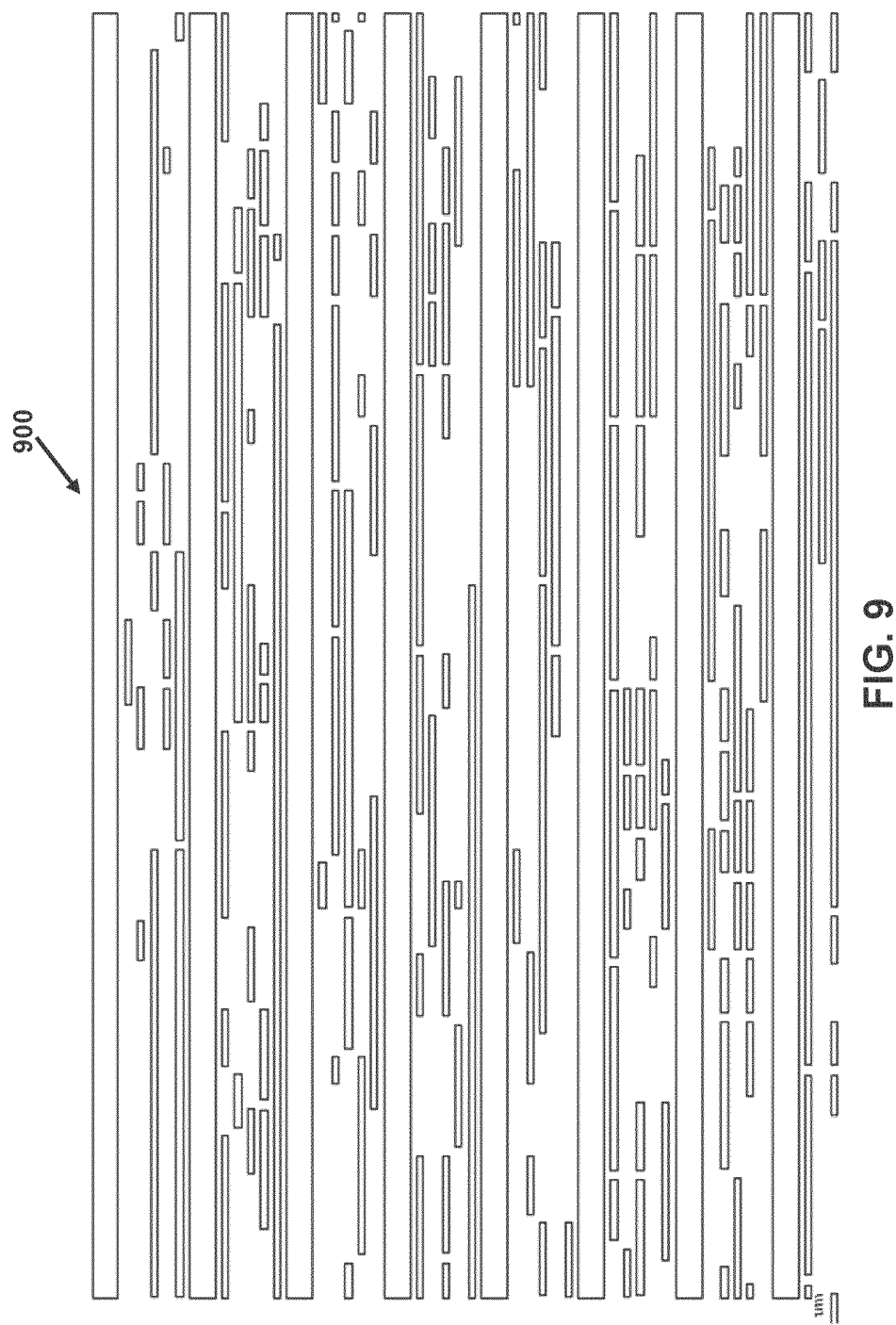
FIG. 9 is an example design layout, according to an embodiment.
Figure 10A:
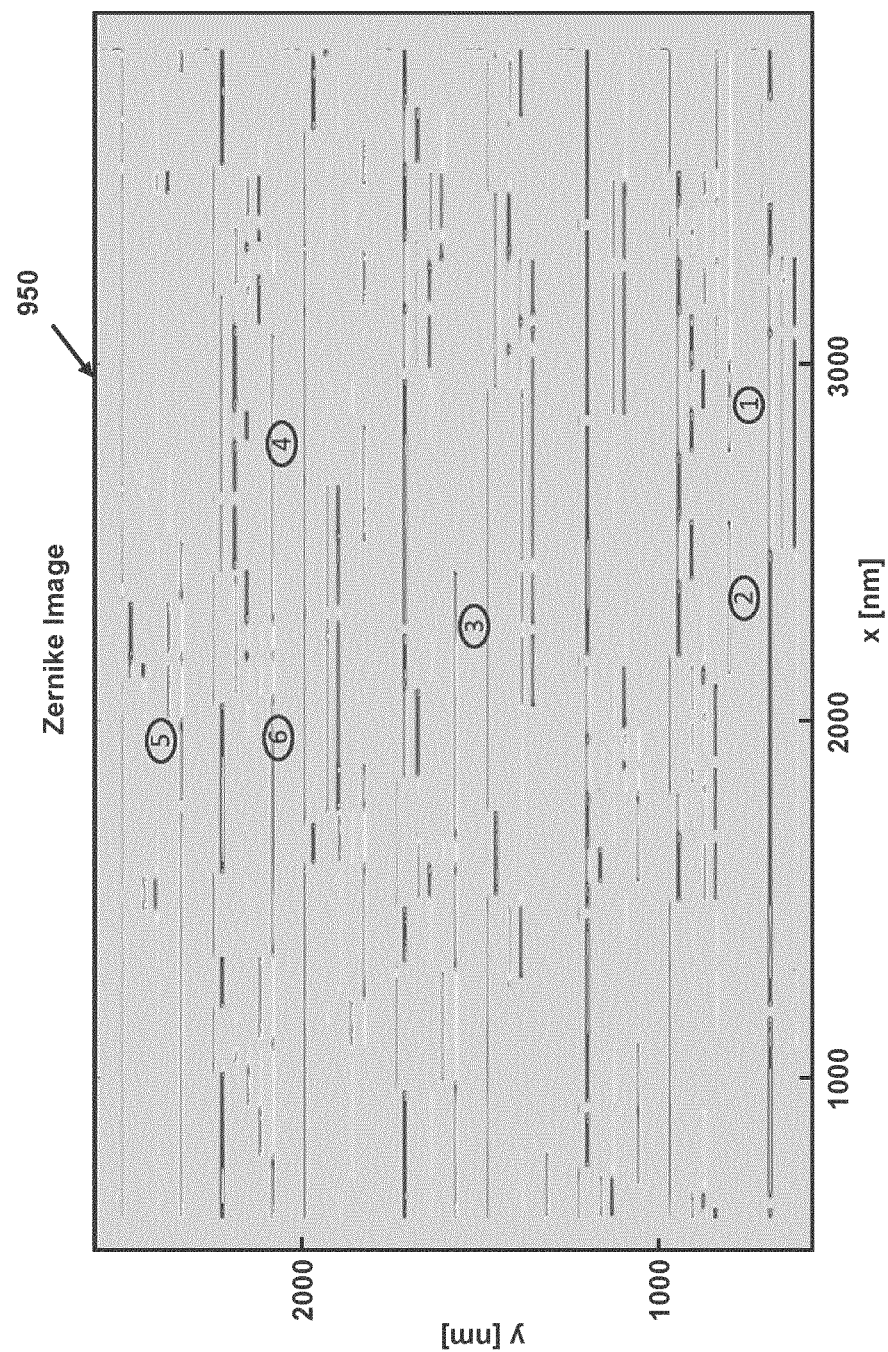
FIG. 10A is an example of an aberration sensitivity map for the design layout in FIG. 9, according to an embodiment.
Figure 10B:
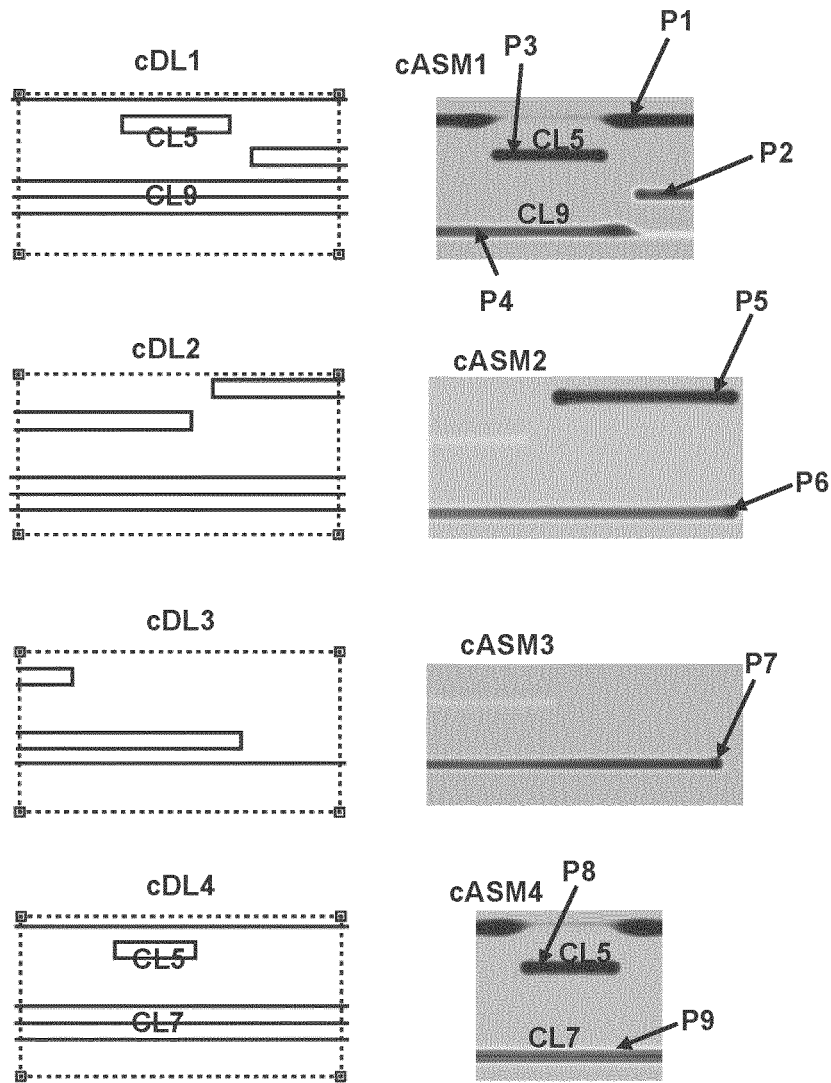
FIG. 10B shows example of 4 selected clips of the design layout of FIG. 9 and corresponding aberration map clips of the aberration map of FIG. 10A, according to an embodiment.
Figure 11:
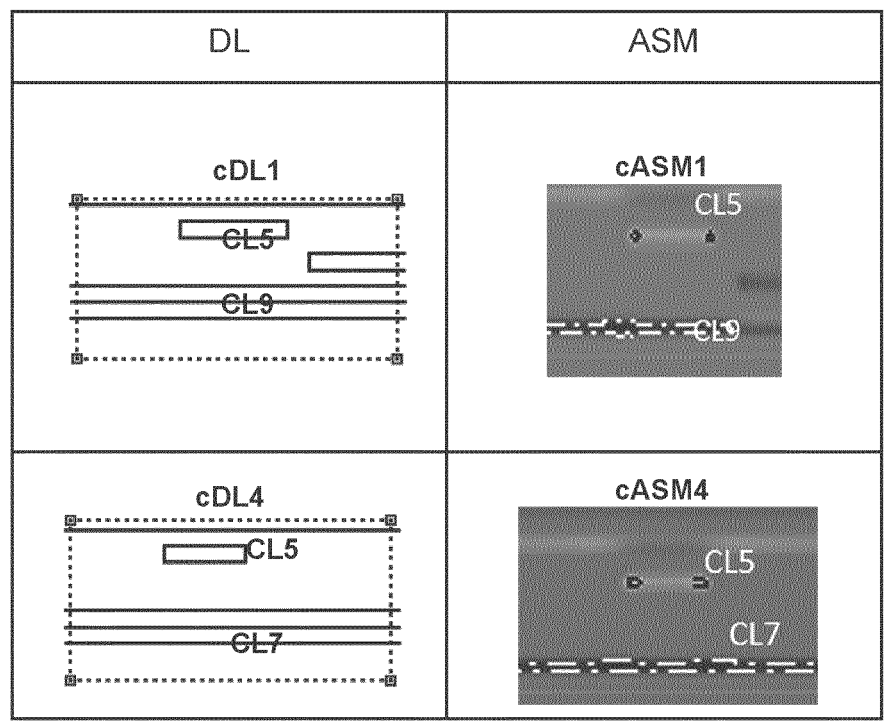
FIG. 11 illustrates example aberration sensitivity clips corresponding to 2 selected clips of design patterns after applying wavefront optimization, according to an embodiment.

FIGS. 9-11 illustrate example of obtaining selected patterns from a design layout based on ZCC kernels for wavefront optimization (e.g., phase controlled optimization). For example, as discussed in the method 300, the ZCC kernels can be applied to a design layout 900 (in FIG. 9) to obtain the aberration sensitivity map 950 (see FIG. 10A).

In FIG. 10A, the aberration sensitivity map 950 show various portions (or locations) where intensity of pixels are substantially higher compared to other locations. For example, 6 locations are marked 1, 2, 3, 4, 5, and 6 within the map 950. In an embodiment, such locations may be selected by a threshold value for the pixel intensity. For example, the pixel intensity values in the image 950 may vary from −10 to 10. A threshold value may be selected as 8 and −8. Hence, if a pixel intensity value breaches the threshold value of the pixel, that pixel is categorized as a location to be analyzed for hot spots. Further, based on the identified 6 locations corresponding locations in the design layout 900 may be selected. In an embodiment, a clip or a portion of the design layout 900 may be selected around the selected 6 locations.

FIG. 10B is a table showing the 4 selected clips e.g., cDL1, cDL2, cDL3, and cDL4 of the design layout 900 and corresponding aberration map clips e.g., cASM1, cASM2, cASM3, and cASM4 of the aberration map 950. In the aberration clip cASM1, the locations P1, P2, P3, and P4 have substantially high sensitivity values. The locations P3 and P4 may have highest sensitivity values, these locations may be used to identify patterns in the design layout. For example, design patterns CL5 and CL9 of clip cDL1 are identified based on the locations P3 and P4. Similarly, based on aberration map clips cASM2, cASM3, and cASM4, locations P5-P9 may be identified as having substantially high sensitivity compared to compared to other locations. Then, based on the locations of P5-P9, corresponding design patterns can be identified from design layout clips cDL2, cDL3, and cDL4, respectively. In an embodiment, the identified design patterns corresponding to P1-P9 or a subset thereof may be classified as hot spots.

Further, for the identified hot spots (e.g., CL5, CL7 and CL9 in clips cDL1 and cDL4 in FIG. 10B), wavefront optimization may be performed so that the aberration sensitivity of the identified design patterns is reduced or minimized In an embodiment, source and/or mask optimization may be performed for the identified design patterns so that the aberration sensitivity is reduced or minimized.

For example, FIG. 11 illustrates example aberration sensitivity clips cASM1' and cASM4' corresponding to the design patterns in clips cDL1 and cDL4 after applying wavefront optimization. In an embodiment, the wavefront optimization may be performed via simulating a patterning process (e.g., in FIG. 13) to determine simulated substrate patterns of the clips cDL1 and cDL2. During the simulation, one or more wavefront parameters (e.g., Zernike coefficients) associated with the wavefront may be determined so that the design patterns in e.g., cDL1 and cDL4 do not become defective after printing on a substrate (e.g., after resist or after etching process). For example, using the simulated substrate pattern, a performance metric CD/PPE or EPE may be minimized for the design patterns cDL1 and cDL4.

Furthermore, in an embodiment, LMC check and/or CD analysis may performed on simulated substrate patterns of the cDL1 and cDL4 to determine whether the patterns are defective (e.g., do not satisfy design specification).

In the present example, Zernike image was used to select 6 hotspots for wavefront optimization. After wavefront optimization, significant reduction of LMC defects was observed. Further, 2 hotspots and 1 weak spot was identified (e.g., based on the aberration sensitivity values) for delta CD analysis. For the two hot spots, applying phase control optimization process (an example of wavefront optimization process) leads to significant delta CD improvement for negative slit locations. Furthermore, offset movements of Z8 component in the negative slit locations was also observed. For the weak spot, there was very small CD asymmetry before and after wavefront optimization which are aligned with weak Zernike image. Hence, the experimental results demonstrated significant improvement in the patterning process, for example, reduction in LMC defects. Thus, using of the aberration sensitivity maps determined using the methods of present disclosure improves the existing state of the technology.

Hence, in an embodiment, based on the aberration sensitivity maps and without performing CD/PPE or EPE calculations, hot spots patterns could be identified. Thus, in an example, the present disclosure improves the computation time of determining hot spots. A faster computation allows determining hot spots for a full chip, which includes million or even billions of patterns. The existing methods involve CD/PPE and EPE (e.g., FIG. 12) calculations that require substantial computation effort and time that hinder such full-chip simulations to determine hot spots. Another example method of obtaining hot spot patterns is discussed in FIG. 14.

Figure 12:
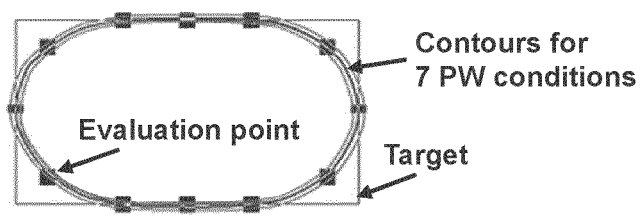
FIG. 12 illustrates an example way to determine EPE, CD, PPE used to determine hot spots, according to an embodiment; need to FIG. 13 is a flow chart of simulation of a patterning process, according an embodiment.

FIG. 12 illustrates an existing example way to determine EPE that is further used to determine hot spots. In FIG. 12, contours are extracted from simulated patterns, where the simulation is performed for 7 different process window conditions. Further, for each contour, at different location (marked as points, also called evaluation points) on the contours EPE is computed as a difference (or distance) between the evaluation point on a given contour and the target contour.

In an embodiment, the method 300 can be used in various applications. For example, the method 300 can further include determining, based on the aberration sensitivity map 310, parameters of the patterning process such that the sensitivity of the PWLP 315 is reduced. For example, values of dose, focus, lens tuning, and other process parameters may be adjusted.

In an embodiment, the method 300 can further include ranking the one or more patterns of the design layout 303 based on the sensitivity values of the aberration sensitivity map 310 or a performance indicator of the aberration sensitivity map 310, wherein a pattern of the one or more patterns related to relatively high sensitivity values are ranked higher compared to other patterns; selecting, based on the ranking, one or more patterns having relatively high rank; and modifying, using the aberration sensitivity map 310 and a mask optimization process, the selected patterns of the design layout 303 so that the sensitivity of the selected patterns is reduced. In an embodiment, the performance indicator can be the CD/PPE asymmetry as indicated by the positive and negative values of Zernike images of, e.g., a two bar pattern shown in FIG. 11.

In an embodiment, a computer program product (e.g., FIG. 15) comprising a non-transitory computer readable medium having instructions recorded thereon, the instructions when executed by a computer implementing any of the procedures of the method described herein.

According to present disclosure, the combination and sub-combinations of disclosed elements constitute separate embodiments. For example, a first combination may be determining process window limiting patterns (PWLP) based on aberration sensitivity. Another example combination may be determining aberration sensitivity map itself.

Figure 13:
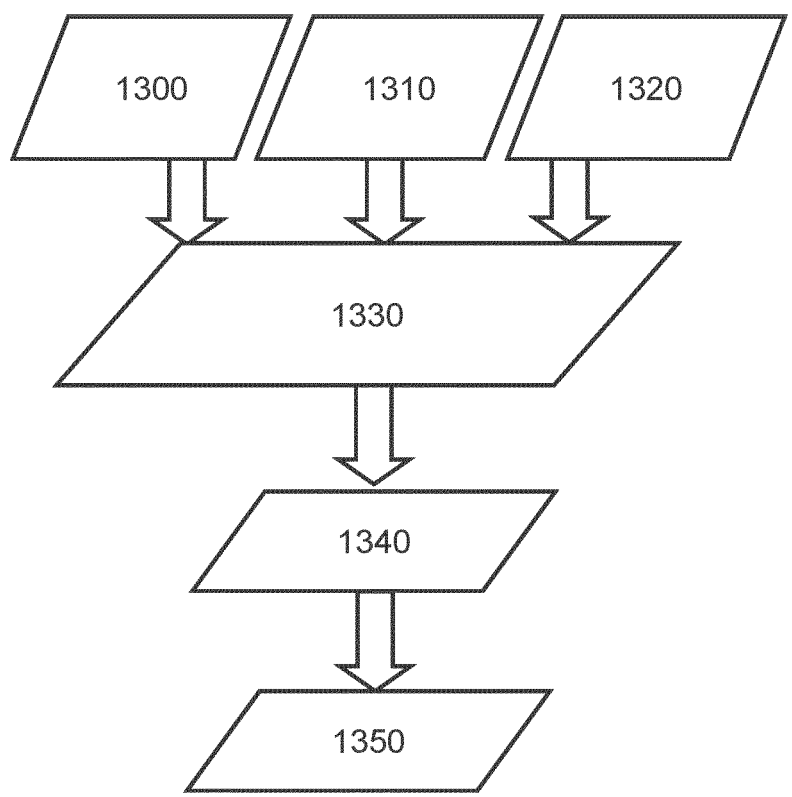

An exemplary flow chart for modeling and/or simulating parts of a patterning process (e.g., lithography in a lithographic apparatus) is illustrated in FIG. 13. As will be appreciated, the models may represent a different patterning process and need not comprise all the models described below. A source model 1300 represents optical characteristics (including radiation intensity distribution, bandwidth and/or phase distribution) of the illumination of a patterning device. The source model 1300 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 1310 represents optical characteristics (including changes to the radiation intensity distribution and/or the phase distribution caused by the projection optics) of the projection optics. The projection optics model 1310 can represent the optical characteristics of the projection optics, including aberration, distortion, one or more refractive indexes, one or more physical sizes, one or more physical dimensions, etc.

The patterning device model module 120 captures how the design features are laid out in the pattern of the patterning device and may include a representation of detailed physical properties of the patterning device, as described, for example, in U.S. Pat. No. 7,587,704. The objective of the simulation is to accurately predict, for example, edge placements and CDs, which can then be compared against the device design. The device design is generally defined as the pre-OPC patterning device layout, and will be provided in a standardized digital file format such as GDSII or OASIS.

A design layout model 1320 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. The design layout model 1320 can represent one or more physical properties of a physical patterning device, as described, for example, in U.S. Pat. No. 7,587,704, which is incorporated by reference in its entirety. Since the patterning device used in the lithographic projection apparatus can be changed, it is desirable to separate the optical properties of the patterning device from the optical properties of the rest of the lithographic projection apparatus including at least the illumination and the projection optics.

An aerial image 1330 can be simulated from the source model 1300, the projection optics model 1310 and the design layout model 1320. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1350 can be simulated from the aerial image 1330 using a resist model 1340. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1310.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 150. The post-pattern transfer process model 150 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Inspection of, e.g., semiconductor wafers is often done with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate.

Figure 14:
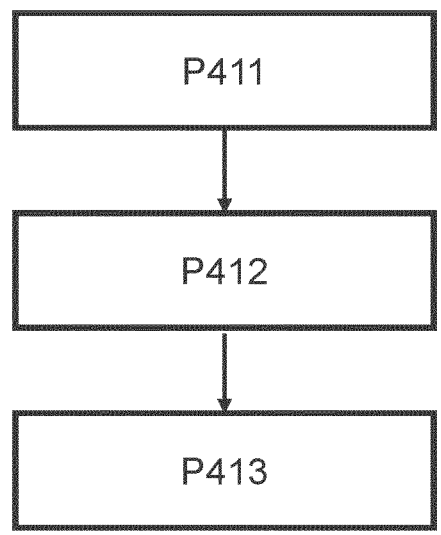
FIG. 14 is a flow chart of determining hot spot patterns, according an embodiment.

FIG. 14 shows a flow chart for a method of determining existence of defects in a lithography process, according to an embodiment. In process P411, hot spots or locations thereof are identified using any suitable method from patterns (e.g., patterns on a patterning device). For example, hot spots may be identified by analyzing patterns on patterns using an empirical model or a computational model. In an empirical model, images (e.g., resist image, optical image, etch image) of the patterns are not simulated; instead, the empirical model predicts defects or probability of defects based on correlations between processing parameters, parameters of the patterns, and the defects. For example, an empirical model may be a classification model or a database of patterns prone to defects. In a computational model, a portion or a characteristic of the images is calculated or simulated, and defects are identified based on the portion or the characteristic. For example, a line pull back defect may be identified by finding a line end too far away from its desired location; a bridging defect may be identified by finding a location where two lines undesirably join; an overlapping defect may be identified by finding two features on separate layers undesirably overlap or undesirably not overlap. An empirical model is usually less computationally expensive than a computational model. It is possible to determine and/or compile process windows of the hot spots into a map, based on hotspot locations and process windows of individual hot spots—i.e. determine process windows as a function of location. This process window map may characterize the layout-specific sensitivities and processing margins of the patterns. In another example, the hot spots, their locations, and/or their process windows may be determined experimentally, such as by FEM wafer inspection or a suitable metrology tool. The defects may include those defects that cannot be detected in an after-development-inspection (ADI) (usually optical inspection), such as resist top loss, resist undercut, etc. Conventional inspection only reveals such defects after the substrate is irreversibly processed (e.g., etched), at which point the wafer cannot be reworked. So, such resist top loss defects cannot be detected using the current optical technology at the time of drafting this document. However, simulation may be used to determine where resist top loss may occur and what the severity would be. Based on this information, it may be either decided to inspect the specific possible defect using a more accurate inspection method (and typically more time consuming) to determine whether the defect needs rework, or it may be decided to rework the imaging of the specific resist layer (remove the resist layer having the resist top loss defect and recoat the wafer to redo the imaging of the specific layer) before the irreversible processing (e.g., etching) is done.

In process P412, processing parameters under which the hot spots are processed (e.g., imaged or etched onto a substrate) are determined. The processing parameters may be local—dependent on the locations of the hot spots, the dies, or both. The processing parameters may be global—independent of the locations of the hot spots and the dies. One exemplary way to determine the processing parameters is to determine the status of the lithographic apparatus. For example, laser bandwidth, focus, dose, source parameters, projection optics parameters, and the spatial or temporal variations of these parameters, may be measured from the lithographic apparatus. Another exemplary way is to infer the processing parameters from data obtained from metrology performed on the substrate, or from operator of the processing apparatus. For example, metrology may include inspecting a substrate using a diffractive tool (e.g., ASML YieldStar), an electron microscope, or other suitable inspection tools. It is possible to obtain processing parameters for any location on a processed substrate, including the identified hot spots. The processing parameters may be compiled into a map—lithographic parameters, or process conditions, as a function of location. Of course, other processing parameters may be represented as functions of location, i.e., a map. In an embodiment, the processing parameters may be determined before, and preferably immediately before processing each hotspot.

In process P413, existence, probability of existence, characteristics, or a combination thereof, of a defect at a hot spot is determined using the processing parameters under which the hot spot is processed. This determination may be simply comparing the processing parameters and the process window of the hot spot—if the processing parameters fall within the process window, no defect exists; if the processing parameters fall outside the process window, at least one defect will be expected to exist. This determination may also be done using a suitable empirical model (including a statistical model). For example, a classification model may be used to provide a probability of existence of a defect. Another way to make this determination is to use a computational model to simulate an image or expected patterning contours of the hot spot under the processing parameters and measure the image or contour parameters. In an embodiment, the processing parameters may be determined immediately (i.e., before processing the pattern or the next substrate) after processing a pattern or a substrate. The determined existence and/or characteristics of a defect may serve as a basis for a decision of disposition: rework or acceptance. In an embodiment, the processing parameters may be used to calculate moving averages of the lithographic parameters. Moving averages are useful to capture long term drifts of the lithographic parameters, without distraction by short term fluctuations.

In an embodiment, hot spots are detected based on the simulated image of pattern on a substrate. Once the simulation of the patterning process (e.g., including process models such OPC and manufacturability check) is complete, potential weak points, i.e., hot spots, in the design as a function of process conditions may be computed according to one or more definitions (e.g., certain rules, thresholds, or metrics). Hot spots may be determined based on absolute CD values, on the rate of change of CD vs. one or more of the parameters that were varied in the simulation ("CD sensitivity"), on the slope of the aerial image intensity, or on NILS (i.e., "edge slope," or "normalized image log slope," often abbreviated as "NILS." Indicating lack of sharpness or image blur) where the edge of the resist feature is expected (computed from a simple threshold/bias model or a more complete resist model). Alternatively, hot spots may be determined based on a set of predetermined rules such as those used in a design rule checking system, including, but not limited to, line-end pullback, corner rounding, proximity to neighboring features, pattern necking or pinching, and other metrics of pattern deformation relative to the desired pattern. The CD sensitivity to small changes in mask CD is a particularly important lithographic parameter known as MEF (Mask Error Factor) or MEEF (Mask Error Enhancement Factor). Computation of MEF vs. focus and exposure provides a critical metric of the probability that mask process variation convolved with wafer process variation will result in unacceptable pattern degradation of a particular pattern element. Hot spots can also be identified based on variation in overlay errors relative to underlying or subsequent process layers and CD variation or by sensitivity to variations in overlay and/or CD between exposures in a multiple-exposure process.

Figure 15:
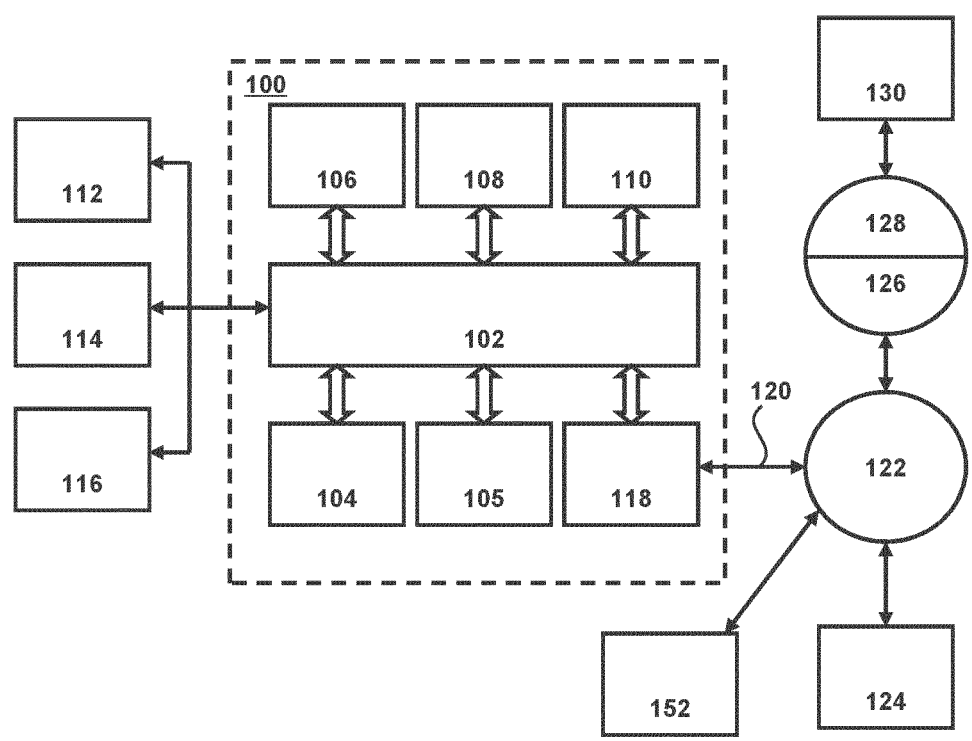
FIG. 15 is a block diagram of an example computer system, according to an embodiment.

FIG. 15 is a block diagram that illustrates a computer system 100 which can assist in implementing the methods, flows or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data (from database 152), including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 16:
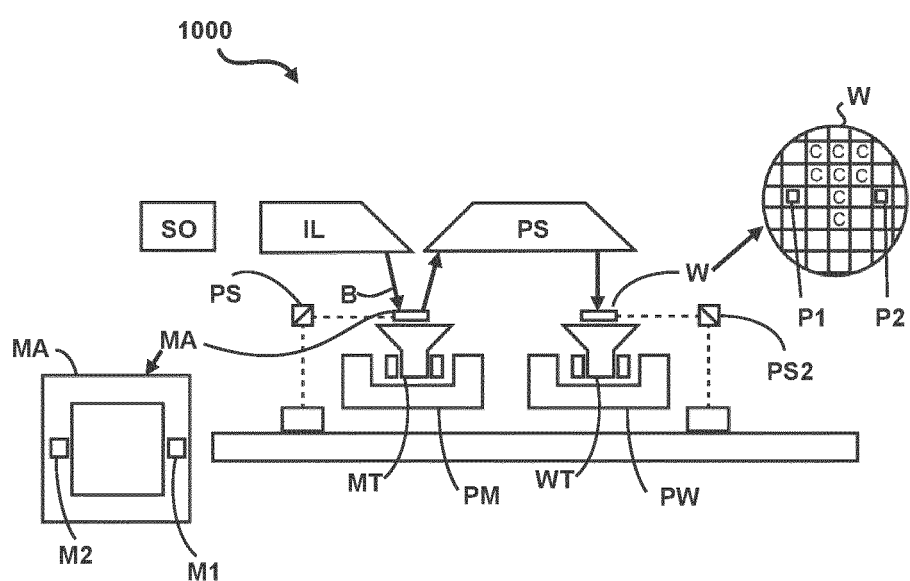
FIG. 16 is a schematic diagram of another lithographic projection apparatus, according to an embodiment.

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
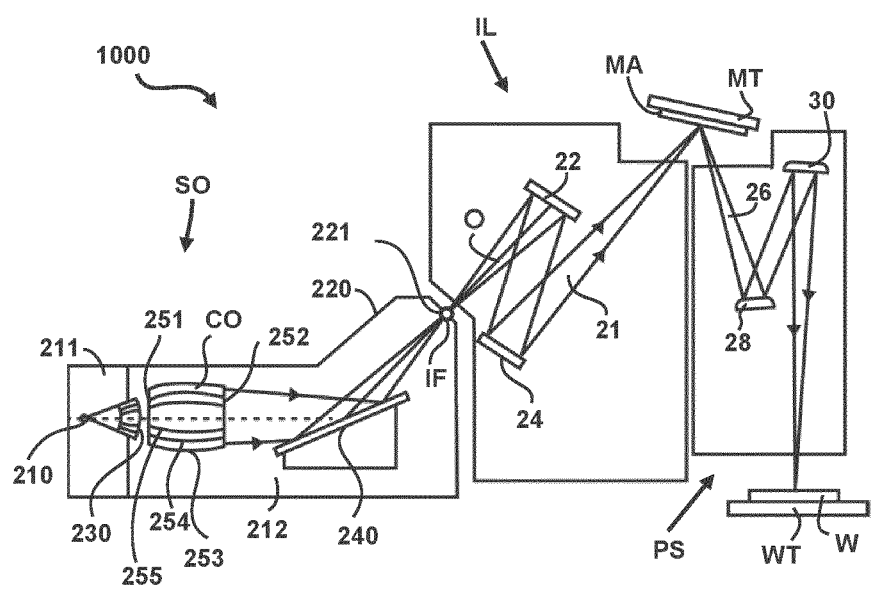
FIG. 17 is a view of the apparatus in FIG. 1 for an extreme ultra violet scanner, according to an embodiment.

FIG. 17 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 18:
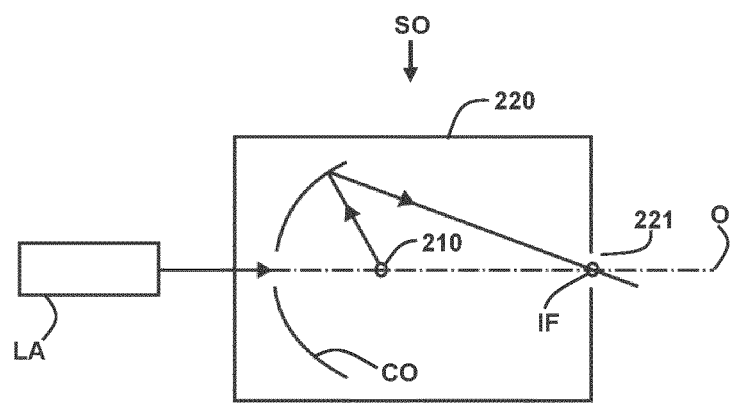
FIG. 18 is a more detailed view of the source collector module SO of the apparatus of FIG. 16 and FIG. 17, according to an embodiment.

Alternatively, the source collector module SO may be part of an LPP radiation system as shown in FIG. 18. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method of determining process window limiting patterns (PWLP) based on aberration sensitivity associated with a patterning apparatus, the method comprising:
    obtaining (i) a first set of kernels and a second set of kernels associated with an aberration wavefront of the patterning apparatus, and (ii) a design layout to be printed on a substrate via the patterning apparatus;
    determining, via a process simulation using the design layout, the first set of kernels, and the second set of kernels, an aberration sensitivity map associated with the aberration wavefront, the aberration sensitivity map indicating how sensitive one or more portions of the design layout are to a particular aberration and an interaction between different aberrations; and
    determining, based on the aberration sensitivity map, the PWLP associated with the design layout having relatively high sensitivity compared to other portions of the design layout.

2. The method of clause 1, wherein the aberration wavefront is represented by a set of Zernike polynomials, Bessel function, a normal and complete function set, or a bitmap image.

3. The method of any of clauses 1-2, wherein the aberration sensitivity map is a pixelated image, wherein a pixel value is indicative of the aberration sensitivity.

4. The method of any of clauses 1-3, wherein the first set of kernels are obtained by eigen decomposition of a first vector associated with a first order aerial image comprising linear aberration terms of the aberration wavefront, wherein:
    the first aerial image is computed by a convolution of a source function, a pupil function, and first order aberrations, the first order aberrations characterize effects of linear aberration terms.
    the source function is a mathematical representation characterizing a illumination source of the patterning apparatus, and
    the pupil function is another mathematical representation characterizing a lens pupil of the patterning apparatus.

5. The method of any of clauses 1-3, wherein the second set of kernels are obtained by eigen decomposition of a second order vector associated with a second aerial image comprising second order aberration terms of the aberration wavefront, wherein:
    the second order aerial image is computed by a convolution of the source function, the pupil function, and second order aberrations, the second order aberrations characterize effects of interaction between different aberrations,
    the source function is the mathematical representation characterizing the illumination source of the patterning apparatus, and
    the pupil function is the another mathematical representation characterizing the lens pupil of the patterning apparatus.

6. The method of any of clauses 2-5, wherein the aberration sensitivity map is a function of the set of Zernike polynomials and a set of Zernike coefficients associated therewith, each Zernike coefficient indicative of an amount of aberration explained by the associated Zernike polynomial;

7. The method of any of clauses 1-6, wherein the determining of the aberration sensitivity map comprises:
    determining a first order aberration sensitivity map by applying the first set of kernels to the design layout;
    determining a second order aberration sensitivity map by applying the second set of kernels to the design layout; and
    determining the aberration sensitivity maps as a sum of the first order aberration sensitivity map, and the second order aberration sensitivity map.

8. The method of any of clauses 1-7, wherein the first set of kernels and the second set of kernels are dependent on parameters associated with the illumination source of the patterning apparatus, the lens pupil of the patterning apparatus, and Zernike terms describing the aberration wavefront associated with the patterning apparatus, but independent of a shape of the design layout.

9. The method of any of clauses 1-8, wherein the determining of the PWLP comprises:
   determining whether an intensity of a pixel of the aberration sensitivity map crosses a hot spot threshold;
   responsive to the intensity breaching the threshold, identifying one or more patterns within the design layout associated with the pixels breaching the threshold; and
   categorizing the identified patterns or locations therearound as the PWLP.
10. The method of clause 9, wherein a pattern of the one or more patterns comprises a plurality of features and a portion of the pattern is a feature of the plurality of features.
11. The method of any of clauses 9-10, wherein the one or more patterns comprises:
   rectilinear mask patterns;
   lines and spaces;
   contact holes; and/or
   curvilinear mask patterns.
12. The method of any of clauses 1-11, wherein the PWLP are determined based on the aberration sensitivity map without tracing a contour of a printed pattern or a simulated pattern, or computing a critical dimension or edge placement error or defects data associated with a printed substrate.
13. The method of any of clauses 1-12, further comprising:
   determining, based on an unaberrated aerial image, and aberrated aerial images, a Zernike image, wherein the aberrated aerial image is determined based on the first, the second order or higher order (order >2) sensitivity maps;
   determining, via principal component analysis of the Zernike image, one or more principal components of the Zernike image, a principal component being a linear combination of Zernike polynomials and associated Zernike coefficients, wherein a value of a Zernike coefficient is indicative of an amount of variation in Zernike image explained by the associated Zernike polynomial;
   selecting, based on at least one of the principal components, patterns associated with relatively a high sensitivity value to a particular Zernike polynomial; and
   determining, via executing a source mask optimization or a wavefront optimization process using the selected patterns, source parameters, mask parameters and/or wavefront parameters such that a performance metric is improved.
14. The method of clause 13, wherein the performance metric is a function of CD or an edge placement error associated with the selected patterns.
15. The method of any of clauses 1-14, wherein the first set of kernels is a first order aberration sensitivity filter for a given Zernike of the set of Zernike polynomials.
16. The method of any of clauses 1-14, wherein the second set of kernels is a second order aberration sensitivity filter for a given Zernike of the set of Zernike polynomials.
17. The method of any of clauses 1-16, wherein the source function is represented as a pixelated image of the illumination source used by the patterning apparatus.
18. The method of any of clauses 1-17, wherein the design layout is at least one of:
   a pre-OPC mask layout;
   a post-OPC mask layout; or
   a mask image generated from the post-OPC mask layout, wherein the mask image represents a mask diffraction pattern obtained by illuminating the post-OPC mask layout with the illumination source.
19. The method of any of clauses 1-18, further comprising:
   determining, based on the aberration sensitivity map, parameters of the patterning process such that the sensitivity of the PWLP is reduced.
20. The method of any of clauses 1-18, further comprising:
   ranking the one or more patterns of the design layout based on the sensitivity values of the aberration sensitivity map or a performance indicator of the aberration sensitivity map, wherein a pattern of the one or more patterns related to relatively high sensitivity values are ranked higher compared to other patterns;
   selecting, based on the ranking, one or more patterns having relatively high rank; and
   modifying, using the aberration sensitivity map and a mask optimization process, the selected patterns of the design layout so that the sensitivity of the selected patterns is reduced.
21. A computer program product comprising a non-transitory computer readable medium having instructions recorded thereon, the instructions when executed by a computer implementing the method of any of the above clauses.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method of determining process window limiting patterns based on aberration sensitivity associated with a patterning apparatus, the method comprising:
   obtaining (i) a first set of kernels and a second set of kernels associated with an aberration wavefront of the patterning apparatus, and (li) a design layout to be printed on a substrate via the patterning apparatus;
   determining, via a process computer simulation using the design layout, via the first set of kernels, and via the second set of kernels, an aberration sensitivity map associated with the aberration wavefront, the aberration sensitivity map indicating how sensitive one or more portions of the design layout are to a particular aberration and an interaction between different aberrations; and
   determining, based on the aberration sensitivity map, a process window limiting pattern associated with the design layout having relatively high sensitivity compared to other portions of the design layout.

2. The method of claim 1, wherein the aberration wavefront is represented by a set of Zernike polynomials, a Bessel function, a normal and complete function set, or a bitmap image.

3. The method of claim 2, wherein the aberration sensitivity map is a function of the set of Zernike polynomials and a set of Zernike coefficients associated therewith, each Zernike coefficient indicative of an amount of aberration explained by the associated Zernike polynomial.

4. The method of claim 1, wherein the aberration sensitivity map is a pixelated image, wherein a pixel value is indicative of the aberration sensitivity.

5. The method of claim 1, wherein the first set of kernels are obtained by eigen decomposition of a first vector associated with a first order aerial image comprising linear aberration terms of the aberration wavefront, wherein:
the first order aerial image is computed by a convolution of a source function, a pupil function, and first order aberrations, the first order aberrations characterizing effects of linear aberration terms,
the source function is a mathematical representation characterizing an illumination of the patterning apparatus, and
the pupil function is another mathematical representation characterizing a lens pupil of the patterning apparatus.

6. The method of claim 1, wherein the second set of kernels are obtained by eigen decomposition of a vector associated with a second order aerial image comprising second order aberration terms of the aberration wavefront, wherein:
the second order aerial image is computed by a convolution of a source function, a pupil function, and second order aberrations, the second order aberrations characterizing effects of interaction between different aberrations,
the source function is a mathematical representation characterizing an illumination of the patterning apparatus, and
the pupil function is another mathematical representation characterizing a lens pupil of the patterning apparatus.

7. The method of claim 1, wherein the determining of the aberration sensitivity map comprises:
determining a first order aberration sensitivity map by applying the first set of kernels to the design layout;
determining a second order aberration sensitivity map by applying the second set of kernels to the design layout; and
determining the aberration sensitivity map associated with the aberration wavefront as a sum of the first order aberration sensitivity map and the second order aberration sensitivity map.

8. The method of claim 1, wherein the first set of kernels and the second set of kernels are dependent on parameters associated with an illumination of the patterning apparatus, a lens pupil of patterning apparatus, and Zernike terms describing the aberration wavefront associated with the patterning apparatus, but independent of a shape of the design layout.

9. The method of claim 1, wherein the determining of the process window limiting pattern comprises:
determining whether an intensity of a pixel of the aberration sensitivity map crosses a hot spot threshold;
responsive to the intensity breaching the threshold, identifying one or more patterns within the design layout associated with the pixel breaching the threshold; and
categorizing the one or more identified patterns or one or more locations therearound as the process window limiting pattern.

10. The method of claim 9, wherein a pattern of the one or more patterns comprises a plurality of features and a portion of the pattern is a feature of the plurality of features, and/or
wherein the one or more patterns comprises:
one or more rectilinear mask patterns;
lines and spaces;
one or more contact holes; and/or
one or more curvilinear mask patterns.

11. The method of claim 1, wherein the process window limiting pattern is determined based on the aberration sensitivity map without tracing a contour of a printed pattern or a simulated pattern, or computing a critical dimension or edge placement error or defect data associated with a printed substrate.

12. The method of claim 1, further comprising:
determining, based on an unaberrated aerial image and an aberrated aerial image, a Zernike image, wherein the aberrated aerial image is determined based on the first order, the second order or higher order (order >2) sensitivity map;
determining, via principal component analysis of the Zernike image, one or more principal components of the Zernike image, a principal component being a linear combination of Zernike polynomials and associated Zernike coefficients, wherein a value of a Zernike coefficient is indicative of an amount of variation in the Zernike image explained by the associated Zernike polynomial;
selecting, based on at least one of the one or more principal components, one or more patterns associated with relatively a high sensitivity value to a particular Zernike polynomial; and
determining, via executing a source mask optimization or a wavefront optimization process using the selected one or more patterns, one or more illumination parameters, one or more mask parameters and/or one or more wavefront parameters such that a performance metric is improved.

13. The method of claim 12, wherein the performance metric is a function of critical dimension or an edge placement error associated with the selected one or more patterns.

14. The method of claim 1, wherein the first set of kernels is a first order aberration sensitivity filter for a given Zernike of a set of Zernike polynomials.

15. A computer program product comprising a non-transitory computer readable medium having instructions therein, the instructions, when executed by a computer system, configured to cause the computer system to at least:
obtain (i) a first set of kernels and a second set of kernels associated with an aberration wavefront of a patterning apparatus, and (ii) a design layout to be printed on a substrate via the patterning apparatus;
determine, via a process simulation using the design layout, via the first set of kernels, and via the second set of kernels, an aberration sensitivity map associated with the aberration wavefront, the aberration sensitivity map indicating how sensitive one or more portions of the design layout are to a particular aberration and an interaction between different aberrations; and
determine, based on the aberration sensitivity map, a process window limiting pattern associated with the design layout having relatively high sensitivity compared to other portions of the design layout.

16. The computer program product of claim 15, wherein the aberration wavefront is represented by a set of Zernike polynomials, a Bessel function, a normal and complete function set, or a bitmap image.

17. The computer program product of claim 15, wherein the aberration sensitivity map is a pixelated image, wherein a pixel value is indicative of the aberration sensitivity.

18. The computer program product of claim 15, wherein the first set of kernels are obtained by eigen decomposition of a vector associated with a first order aerial image comprising linear aberration terms of the aberration wavefront, wherein:

the first order aerial image is computed by a convolution of a source function, a pupil function, and first order aberrations, the first order aberrations characterizing effects of linear aberration terms, the source function is a mathematical representation characterizing an illumination of the patterning apparatus, and the pupil function is another mathematical representation characterizing a lens pupil of the patterning apparatus.

19. The computer program product of claim 15, wherein the second set of kernels are obtained by eigen decomposition of a vector associated with a second order aerial image comprising second order aberration terms of the aberration wavefront, wherein:

the second order aerial image is computed by a convolution of a source function, a pupil function, and second order aberrations, the second order aberrations characterizing effects of interaction between different aberrations, the source function is a mathematical representation characterizing an illumination of the patterning apparatus, and the pupil function is another mathematical representation characterizing a lens pupil of the patterning apparatus.

20. The computer program product of claim 15, wherein the instructions configured to cause the computer system to determine the aberration sensitivity map are further configured to cause the computer system to:

determine a first order aberration sensitivity map by applying the first set of kernels to the design layout;

determine a second order aberration sensitivity map by applying the second set of kernels to the design layout; and determine the aberration sensitivity map associated with the aberration wavefront as a sum of the first order aberration sensitivity map and the second order aberration sensitivity map.

\* \* \* \* \*